United States Patent
Kato et al.

(10) Patent No.: US 9,203,288 B2
(45) Date of Patent: Dec. 1, 2015

(54) ROTARY ELECTRIC MACHINE WITH POWER CONVERTER

(71) Applicant: Mitsubishi Electric Corporation, Chiyoda-ku, Tokyo (JP)

(72) Inventors: Masaki Kato, Chiyoda-ku (JP); Masahiko Fujita, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/271,803

(22) Filed: May 7, 2014

(65) Prior Publication Data

US 2015/0162808 A1 Jun. 11, 2015

(30) Foreign Application Priority Data

Dec. 9, 2013 (JP) .................................. 2013-253767

(51) Int. Cl.
*H02K 11/00* (2006.01)
*H02K 9/22* (2006.01)
(52) U.S. Cl.
CPC .............. *H02K 11/0073* (2013.01); *H02K 9/22* (2013.01); *H02K 11/0015* (2013.01)
(58) Field of Classification Search
USPC ............................................. 310/68 D, 68 R
See application file for complete search history.

(56) References Cited

U.S. PATENT DOCUMENTS

| | | | | |
|---|---|---|---|---|
| 6,183,426 | B1 * | 2/2001 | Akisada et al. | .................... 601/2 |
| 6,194,856 | B1 * | 2/2001 | Kobayashi et al. | ............ 318/432 |
| 6,885,162 | B2 * | 4/2005 | Stridsberg | ................ 318/400.29 |
| 2006/0202573 | A1 * | 9/2006 | Uehara et al. | .................... 310/64 |
| 2011/0175496 | A1 * | 7/2011 | Shirakata et al. | ........... 310/68 R |
| 2013/0307130 | A1 | 11/2013 | Oga et al. | |

FOREIGN PATENT DOCUMENTS

| | | |
|---|---|---|
| JP | 2000217367 A | 8/2000 |
| JP | 2006174541 A | 6/2006 |
| JP | 2012249418 A | 12/2012 |
| WO | 2012-169044 A1 | 12/2012 |

OTHER PUBLICATIONS

Communication dated Nov. 25, 2014, issued by the Japan Patent Office in corresponding Japanese Application No. 2013-253767.

* cited by examiner

*Primary Examiner* — Naishadh Desai

(74) *Attorney, Agent, or Firm* — Sughrue Mion, PLLC; Richard C. Turner

(57) ABSTRACT

A rotary electric machine with a power converter includes: a stator that has stator windings; a rotor that has a rotor winding; a rotational position detecting sensor that outputs a rotational position signal of the rotor; a case that contains the stator and the rotor; a field module that is connected to the rotor winding; power modules, each of which is connected to each of the stator windings and has a current detector, a first switching element, and a second switching element; a heat sink fixed to the field module and the power modules; and a control substrate that outputs control signals to the field module and the power modules based on the rotational position signal from the rotational position detecting sensor. The first switching element is connected in series to the second switching element; and the current detector and both switching element are molded with insulating resin.

5 Claims, 7 Drawing Sheets

ROTARY ELECTRIC MACHINE WITH POWER CONVERTER

BACKGROUND OF THE INVENTION

1. Field of the Invention

The present invention relates to rotary electric machines and, more particularly, relates to a rotary electric machine mounted with a power converter.

2. Description of the Related Art

An alternator is a kind of a generator and is a device that converts mechanical kinetic energy transferred from an engine or the like into alternating current (AC) electrical energy. The alternator or the alternator serving also as a starter is mounted with a power converter on its main body. The power converter is equipped with power modules formed by molding a plurality of switching elements with insulating resin (for example, see Patent Document 1). The switching element includes a power transistor, a metal oxide semiconductor field effect transistor (MOSFET), an insulated gate bipolar transistor (IGBT), and the like.

Current detectors, each of which detects a phase current flowing through the switching element, are arranged in the power converter. The current detectors detect a plurality of phase currents; and ON/OFF of the switching elements mounted on terminals are performed by pulse width modulation (PWM) control. If this method is adopted for attaining a high output, a space for arranging the current detectors and a heat dissipation structure for cooling the generated heat of the current detectors are needed for the power converter. Joint between the power module and the current detector is made to constitute a circuit.

PATENT DOCUMENT

[Patent Document 1] International Unexamined Patent Publication No. WO 2012/169044 A1

BRIEF SUMMARY OF THE INVENTION

The present invention has been made to solve the above described problem, and an object of the present invention is to obtain a rotary electric machine equipped with a power converter in which a current detector is incorporated in a power module to improve productivity and to provide high heat dissipation performance and compactness.

According to the present invention, there is provided a rotary electric machine with a power converter, which includes: a stator that has stator windings; a rotor that has a rotor winding; a rotational position detecting sensor that outputs a rotational position signal of the rotor; a case that contains the stator and the rotor; a field module that is connected to the rotor winding; power modules, each of which is connected to each of the stator windings and has a current detector, a first switching element, and a second switching element; a heat sink that is fixed to the field module and the power modules; and a control substrate that outputs control signals to the field module and the power modules based on the rotational position signal from the rotational position detecting sensor. The first switching element is connected in series to the second switching element; and the current detector, the first switching element, and the second switching element are molded with insulating resin.

According to the rotary electric machine with the power converter according to the present invention, effects can be exhibited in that: the power converter is mounted with the current detector in the power module, whereby a heat dissipation structure similar to a heat dissipation structure of the switching elements can be adopted; further, the current detector is molded with insulating resin, thereby being less affected by outside environment; moreover, the current detector can be also mounted in the case of mounting the switching elements on the terminals, whereby productivity is improved; and additionally, the current detector can be mounted adjacent to upper and lower arms composed of the switching elements of the power module, whereby the power converter can be reduced in size.

DETAILED DESCRIPTION OF THE INVENTION

Hereinafter, embodiments of a rotary electric machine with a power converter according to the present invention will be described in detail with reference to drawings. Incidentally, the present invention is not limited to the following description, but can be appropriately changed without departing from the spirit or scope of the present invention.

Embodiment 1

Figure 1:
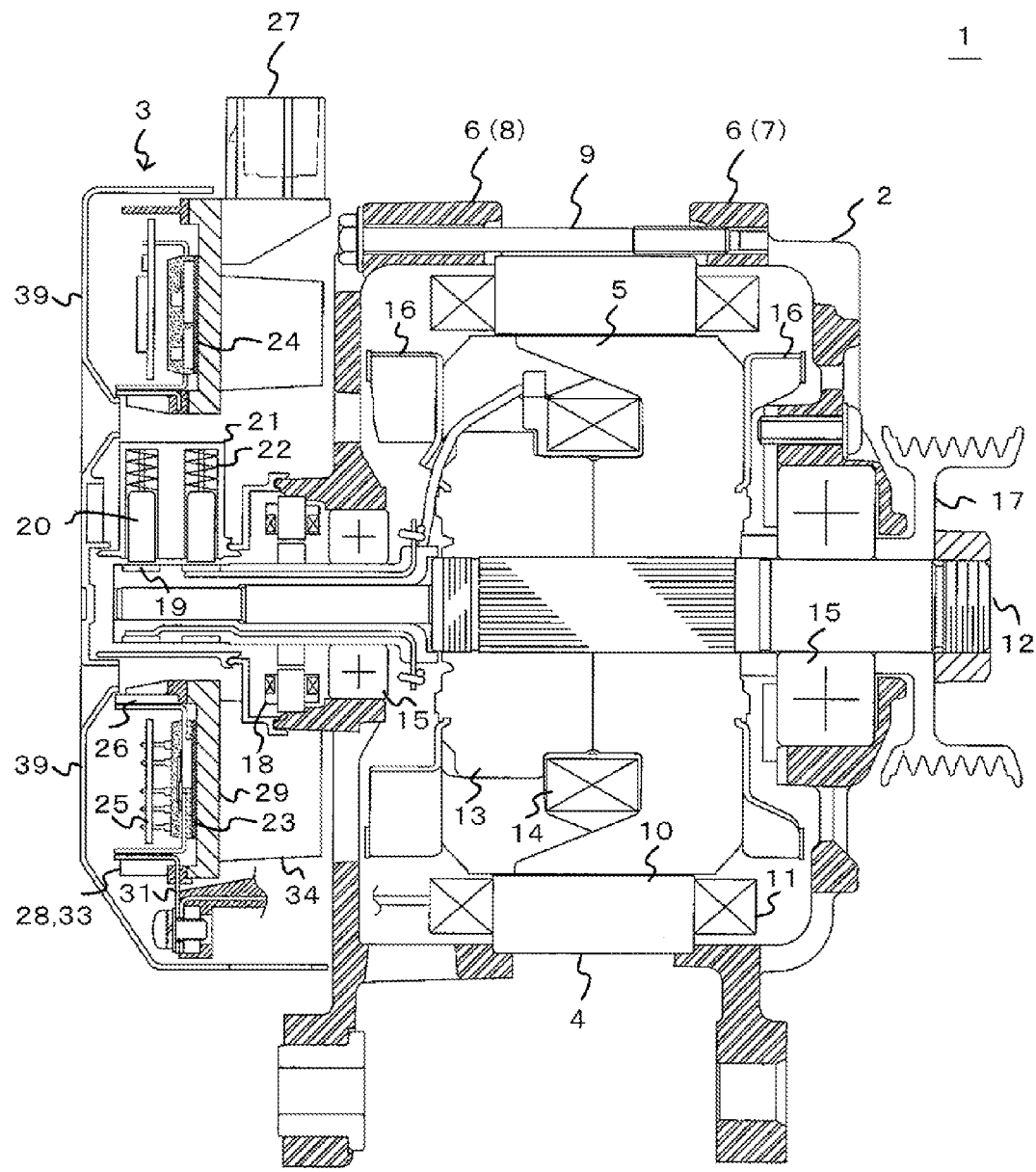
FIG. 1 is a longitudinal sectional view showing a rotary electric machine with a power converter according to embodiments of the present invention.

FIG. 1 is a sectional view showing a rotary electric machine with a power converter according to embodiments of the present invention. A machine/electricity integral type rotary electric machine with a power converter 1 equipped with a rotary electric machine 2 and a power converter 3. The rotary electric machine 2 includes an AC generator motor (motor generator). The rotary electric machine 2 is composed of a tubular stator 4, a rotor 5 that is arranged inside the stator 4 and rotates with respect to the stator 4, and a metallic case (support body) 6 that supports the stator 4 and the rotor 5. The case 6 is divided into a front bracket 7 and a rear bracket 8. The stator 4 is sandwiched by the front bracket 7 and the rear bracket 8. The front bracket 7 and the rear bracket 8 are fastened by a plurality of fastening bolts 9.

The stator 4 has a stator core 10 and stator windings (armature windings) 11. The tubular stator core 10 is fixed to each of the front bracket 7 and the rear bracket 8. The stator windings 11 are placed on the stator core 10. The rotor 5 has a rotational shaft 12, a rotor core 13, and a rotor winding (field winding) 14. The rotor core 13 is fixed at an intermediate portion of the rotational shaft 12. The rotational shaft 12 is arranged on the axis line of the rotor 5 and passes through the front bracket 7 and the rear bracket 8. The rotational shaft 12 is rotatably supported to each of the front bracket 7 and the rear bracket 8 via each of bearings 15. The rotor winding (field winding) 14 is placed on the rotor core 13.

An outer peripheral portion of the rotor core 13 is opposite to an inner peripheral portion of the stator 4. The rotor core 13 is provided with a cooling fan for blowing air 16, the cooling fan 16 being integrally rotated with the rotor 5. A pulley 17 is fixed to an end on the front bracket side of the rotational shaft 12. A transmission belt (not shown in the drawing) operatively connected with the rotational shaft of an engine is wound around the pulley 17. A rotational position detecting sensor 18 that generates a rotational position signal in response to the rotational position of the rotational shaft 12 and a plurality of slip rings 19 electrically connected to the rotor winding 14 are placed on the rear side of the rotational shaft 12. A brush holder 21 is placed on the rear bracket 8 with respect to each of the slip rings 19. The brush holder 21 guides a brush 20 in a direction where the slip ring 19 comes into contact with or separates from the rotational shaft 12.

The slip ring 19 is an annular conductive member that surrounds an outer peripheral portion of the rotational shaft 12. The conductive brush 20 comes in contact with each of the slip rings 19. A field current that makes the rotor 5 generate a magnetic field is supplied from the brushes 20 to the slip rings 19. The brush holder 21 is provided with a pressing spring 22 that individually biases the brush 20 in a direction coming into contact with the slip ring 19. The brush 20 is pressed to the slip ring 19 by the biasing force of the pressing spring 22. When the rotor 5 rotates, the slip rings 19 slide with respect to the brushes 20. The power converter 3 is supported by the rear bracket 8.

A cover 39 formed of resin covers the power converter 3. The power converter 3 includes power modules 23, a field module 24, a control substrate 25, an external connection connector 27, a heat sink 29, a cooling fin 34, a conductive busbar structure 31, and the like. The power modules 23 and the field module 24 are connected to the conductive busbar structure 31. The control substrate 25 which is for performing PWM control of the power modules 23 has a torus shape and is arranged on the upper sides of flat surface portions of the power modules on the side opposite to the heat sink 29. The field module 24 and the power modules 23, which are fixed to the heat sink 29, are mounted on the cooling fin 34. The conductive busbar structure 31 is manufactured by molding power input/output terminals 26, N terminals 28, and AC terminals 33. The power modules 23 and the field module 24 are fixed to the heat sink 29 by using insulating adhesive.

Figure 2:
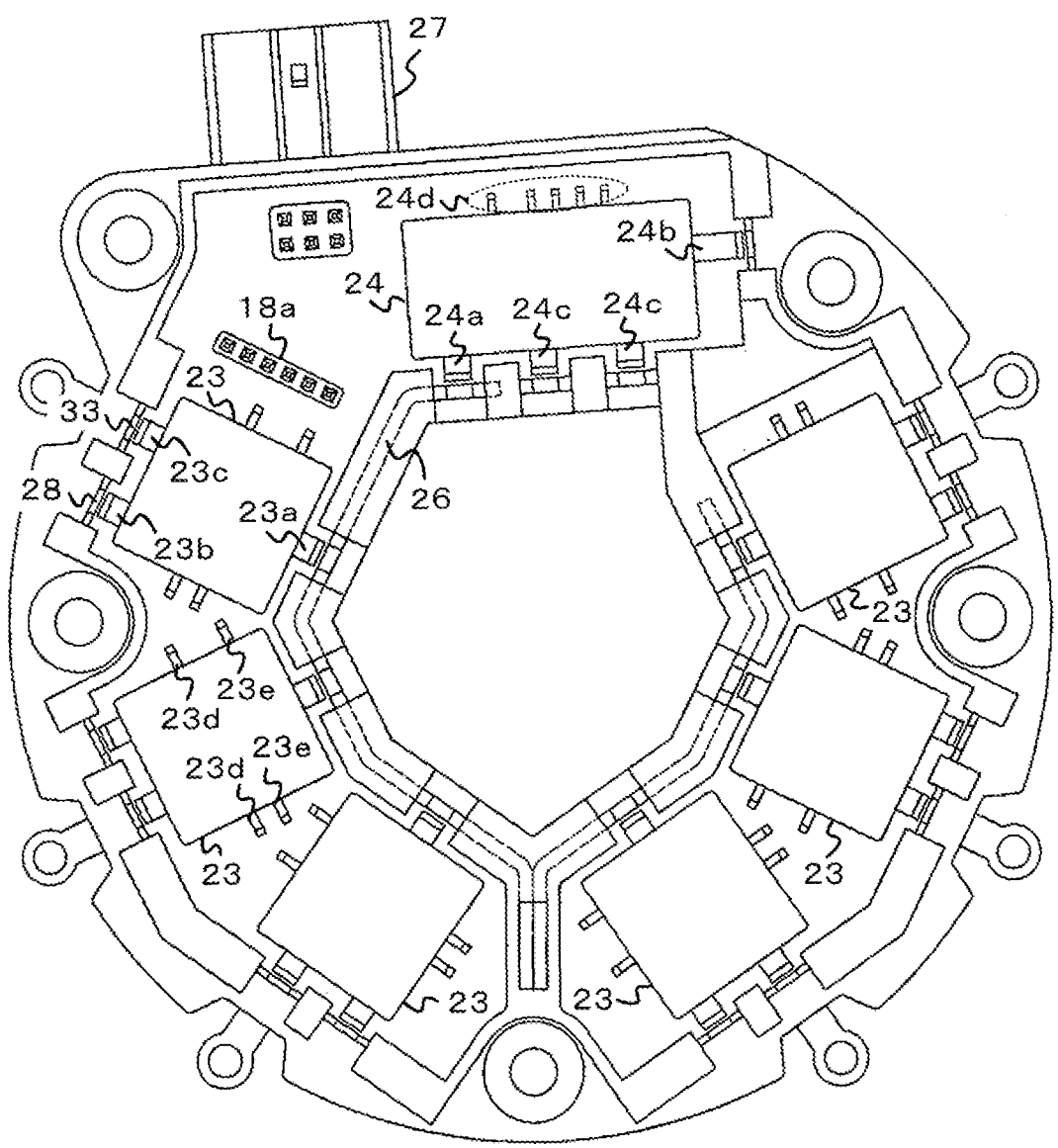
FIG. 2 is a view in which a power converter according to Embodiment 1 of the present invention is seen from the rear side.

FIG. 2 is a view in which the power converter 3 in Embodiment 1 of the present invention is seen from the rear side. Signal information from an external device (engine control unit or the like) is transferred to the power converter 3 via the external connection connector 27. In order to understand easily, this drawing represents a state before the torus-shape control substrate 25 is attached. One field module 24 and six power modules 23 are shown in the drawing. Signal end terminals 18a of the rotational position detecting sensor 18 are connected to the control substrate 25. The field module 24 has a battery end terminal 24a, a grounding end terminal 24b, field winding connection end terminals 24c, and signal end terminals 24d.

Each of the power modules 23 has a P end terminal 23a, an N end terminal 23b, an AC end terminal 23c, signal end terminals 23d, and signal end terminals 23e. The P end terminal 23a of the power module 23 is connected to the power input/output terminal 26. The N end terminal 23b of the power module 23 is connected to the N terminal 28. The AC end terminal 23c of the power module 23 is connected to the AC terminal 33.

Figure 3:
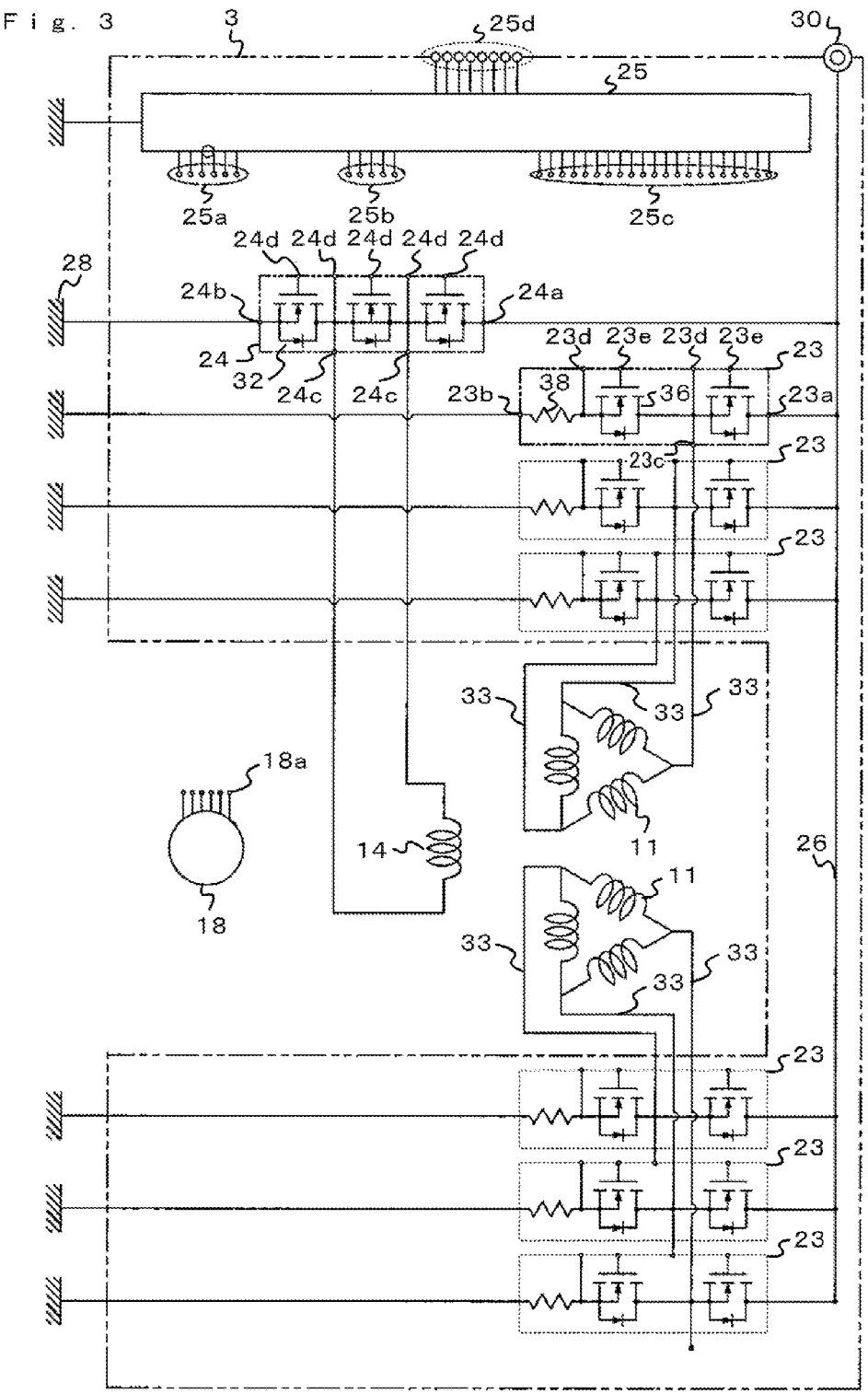
FIG. 3 is an electrical circuit diagram of a rotary electric machine with the power converter according to Embodiment 1 of the present invention.

FIG. 3 is an electrical circuit diagram of the rotary electric machine according to Embodiment 1 of the present invention. The operation of the power converter 3 will be described with reference to this drawing. The power converter 3 is electrically connected to the stator windings 11. Six power modules 23 and one field module 24 are shown in the drawing. Each of the power modules 23 shows a circuit for one phase of a three phase bridge circuit that constitutes a circuit of the power converter 3. The power module 23 is manufactured by molding a pair of elements in which two switching elements 36 for carrying a stator current are connected in series and a current detector 38.

The AC end terminal 23c of the power module 23 is AC input/output to be connected to the stator winding 11. The signal end terminal 23d is connected to a contact point between a drain of a first switching element 36a and a source of a second switching element 36b. The signal end terminal 23e of the power module 23 is connected to a gate electrode of the switching element 36. Two switching elements 36 are connected in series. The switching element 36 on the right side corresponds to an upper arm; and the switching element 36 on the left side corresponds to a lower arm. A shunt resistance is preferable to be used for the current detector 38.

The field module 24 is manufactured by molding a plurality of switching elements 32 that carry a field current. In this case, the field module 24 is equipped with three switching elements 32. The field module 24 adjusts power from a battery 30 and supplies to the rotor winding 14 as the field current based on control signals from the control substrate 25.

Signal end terminals 18a of the rotational position detecting sensor 18 are connected to substrate end terminals 25a of the control substrate 25. The signal end terminals 24d of the field module 24 are connected to substrate end terminals 25b of the control substrate 25. The signal end terminals 23d and the signal end terminals 23e of the power modules 23 are connected to substrate end terminals 25c of the control substrate 25. Signal end terminals of the external connection connector 27 are connected to substrate end terminals 25d of the control substrate 25. The control substrate 25 outputs the control signals to the field module 24 and the power modules 23 based on the rotational position signal of the rotor 5 from the rotational position detecting sensor 18 and signal information from the external device (engine control unit or the like) transferred via the external connection connector 27.

Direct current (DC) power from the battery 30 is supplied to each of the power modules 23 and the field module 24 at the time of starting up the engine. The field module 24 adjusts the DC power from the battery 30 into the field current by the control of the control substrate 25. The field current from the field module 24 is supplied to the rotor winding 14 via the brushes 20 and the slip rings 19. This generates a DC magnetic field in the rotor 5. The control substrate 25 makes the power modules 23 perform switching operation by the PWM control from a plurality of phase current values detected by the current detectors 38. This converts the DC power from the battery 30 into AC power.

The AC power converted by the power modules 23 is supplied to the stator windings 11. A rotating magnetic field is generated in the stator 4 to rotate the rotor 5. The pulley 17 is rotated by the rotation of the rotor 5 to start up the engine. After starting up the engine, rotative power from the engine is transferred to the pulley 17. This rotates the rotor 5 and thus AC power is induced in the stator windings 11. At this time, the power modules 23 perform switching operation by the PWM control of the control substrate 25 from the plurality of phase current values detected by the current detectors 38. This converts the AC power induced in the stator windings 11 into DC power. After that, the DC power from the power modules 23 is charged in the battery 30.

Figure 4:
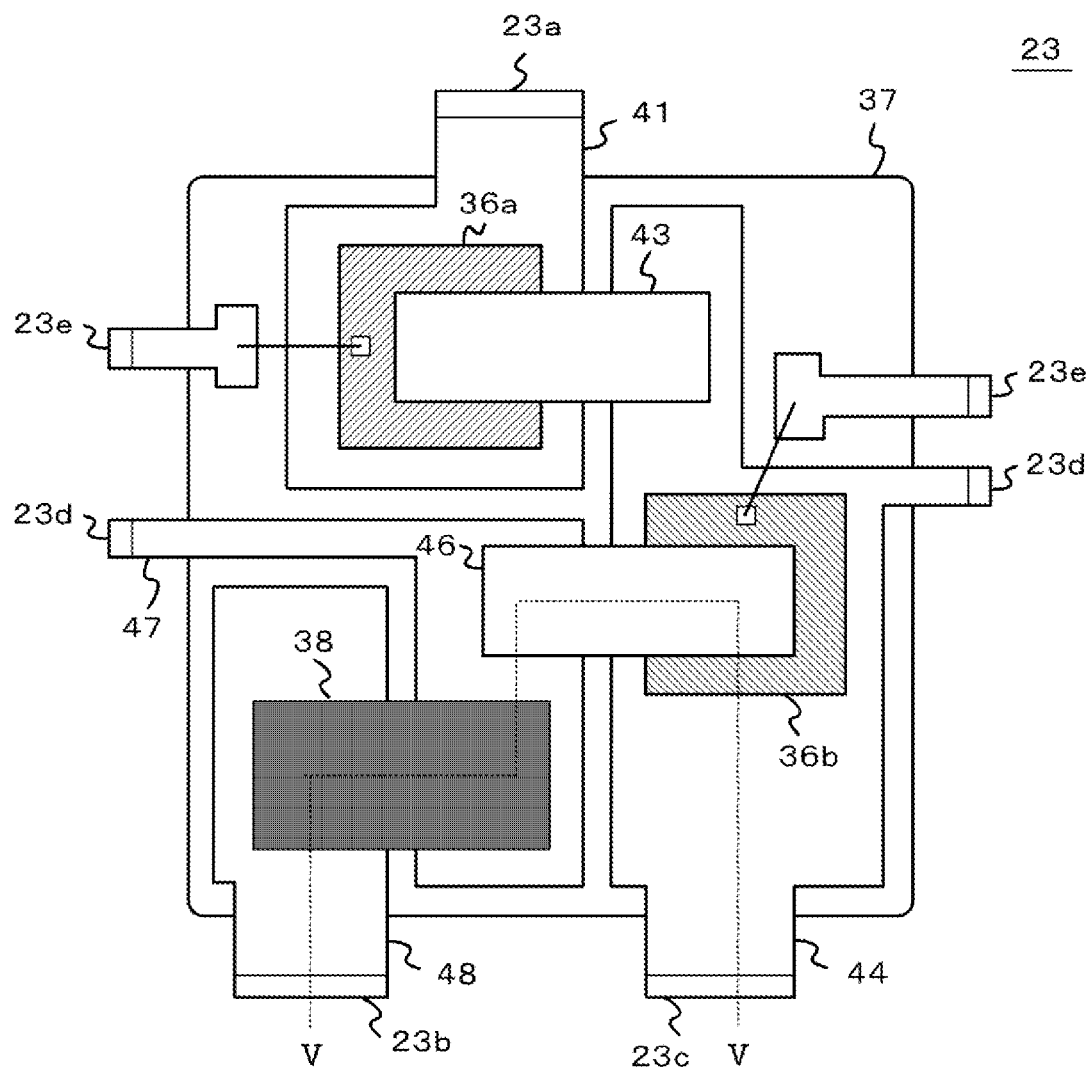
FIG. 4 is a configuration view of a power module according to Embodiment 1 of the present invention.

Next, the mounting configuration of the power module 23 in Embodiment 1 will be described by using FIG. 4. In the power converter 3, the power module 23 corresponds to the circuit for one phase of the three phase bridge circuit. The first switching element 36*a* is connected in series to the second switching element 36*b*. The gate electrode of the first switching element 36*a* and the gate electrode of the second switching element 36*b* are each connected to each of the signal end terminals 23*e*. The first switching element 36*a* is arranged on a first terminal 41 and a lower surface electrode of the first switching element 36*a* is joined to the first terminal 41 via solder.

One end of a first internal lead 43 is joined to an upper surface electrode of the first switching element 36*a* via solder and the other end of the first internal lead 43 is joined to a second terminal 44 via solder (constituting the upper arm). The second switching element 36*b* is arranged on the second terminal 44 and a lower surface electrode of the second switching element 36*b* is joined to the second terminal 44 via solder. One end of a second internal lead 46 is joined to an upper surface electrode of the second switching element 36*b* via solder. The other end of the second internal lead 46 is joined to a third terminal 47 via solder (constituting the lower arm).

One end of the current detector 38 is joined on the third terminal 47 via solder and the other end of the current detector 38 is joined to a fourth terminal 48 via solder. The power converter 3 is molded by using insulating resin 37 such as silicone resin having a linear expansion coefficient near that of the terminal. The periphery of a joint portion of the current detector 38 is solidified with the insulating resin 37; and therefore, the current detector 38 is less likely to be affected by outside environment and, moreover, can reduce stress due to repeated thermal expansion and contraction to extend duration of life.

Figure 5:
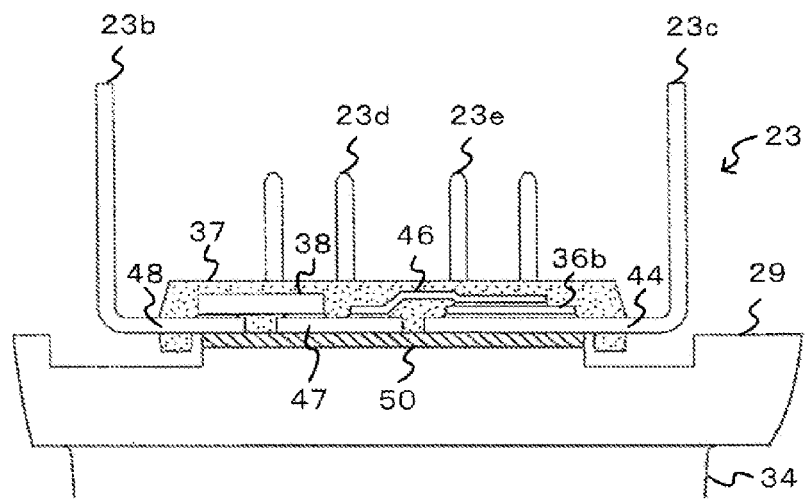
FIG. 5 is a sectional view of the power module according to Embodiment 1 of the present invention.

FIG. 5 shows a sectional view of the power module. The power module 23 is fixed to the heat sink 29 by using, for example, silicone insulating adhesive 50. The heat sink 29 is attached to the cooling fin 34 by screws or the like. The second terminal 44, the third terminal 47, and the fourth terminal 48 are arranged in a lowermost layer. Similarly, the first terminal 41 and the signal end terminals 23*e* are also arranged in the lowermost layer. These members arranged in the lowermost layer are exposed from the insulating resin 37 and thus can be directly bonded to the heat sink 29 with the silicone insulating adhesive 50. The current detector 38 and the second switching element 36*b* (and the first switching element 36*a*) are arranged in a second layer.

According to this Embodiment 1, the power module 23 is arranged on the heat sink 29; and therefore, the generated heat of the current detector 38 can be dissipated from the heat sink via the terminals as in the switching elements. Furthermore, the joint of the current detector 38 and the terminals is the same soldering as the joint of the switching elements and the terminals; and therefore, mounting can be made simultaneously by one process. Besides, one of electrodes of the current detector 38 is directly mounted on the third terminal 47; and therefore, the power converter can be reduced beyond an increase in size of the power module 23.

Embodiment 2

Figure 6:
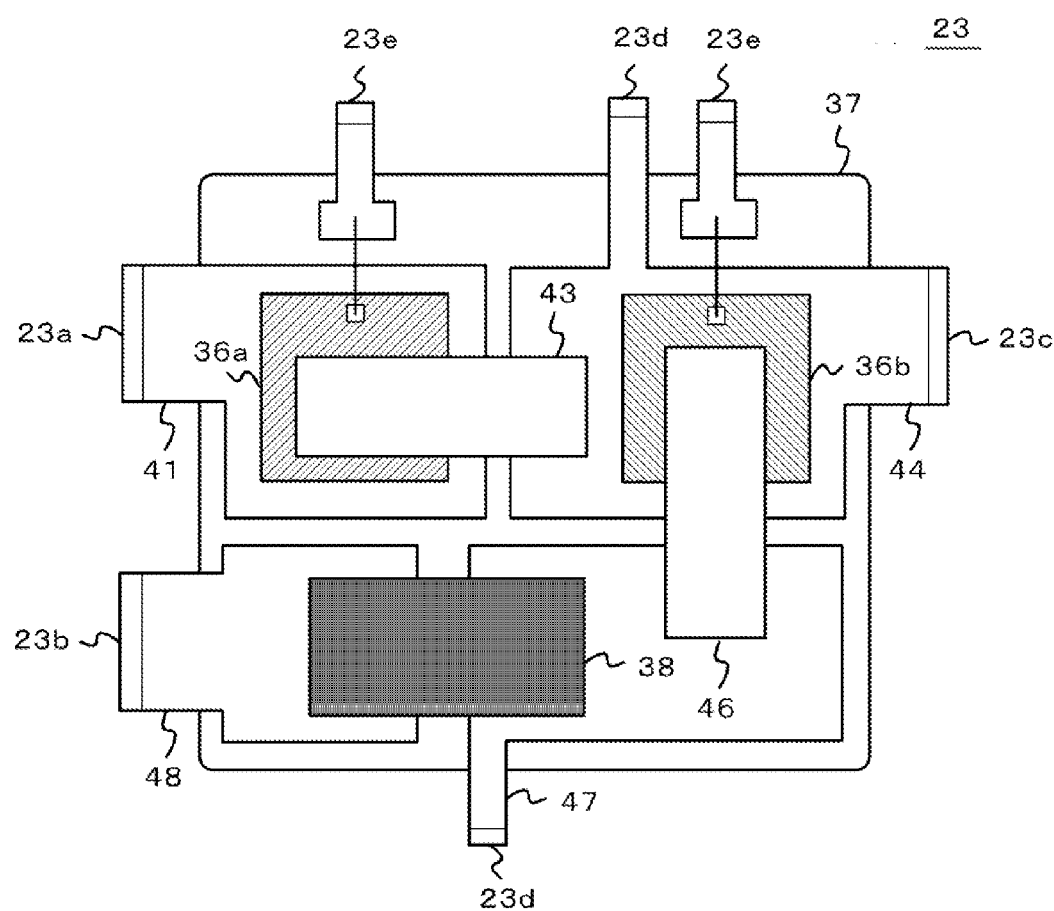
FIG. 6 is a configuration view of a power module according to Embodiment 2 of the present invention.

The mounting configuration of a power module 23 in Embodiment 2 will be described by using FIG. 6. In Embodiment 1, the P end terminal 23*a* and the N end terminal 23*b* of the power module 23 are led out from different edges of the insulating resin 37; however, in Embodiment 2, a P end terminal 23*a* and an N end terminal 23*b* are led out from the same edge. This configuration can provide the shortest circuit path from the P end terminal to the N terminal; and therefore, inductance can be reduced.

Embodiment 3

Figure 7:
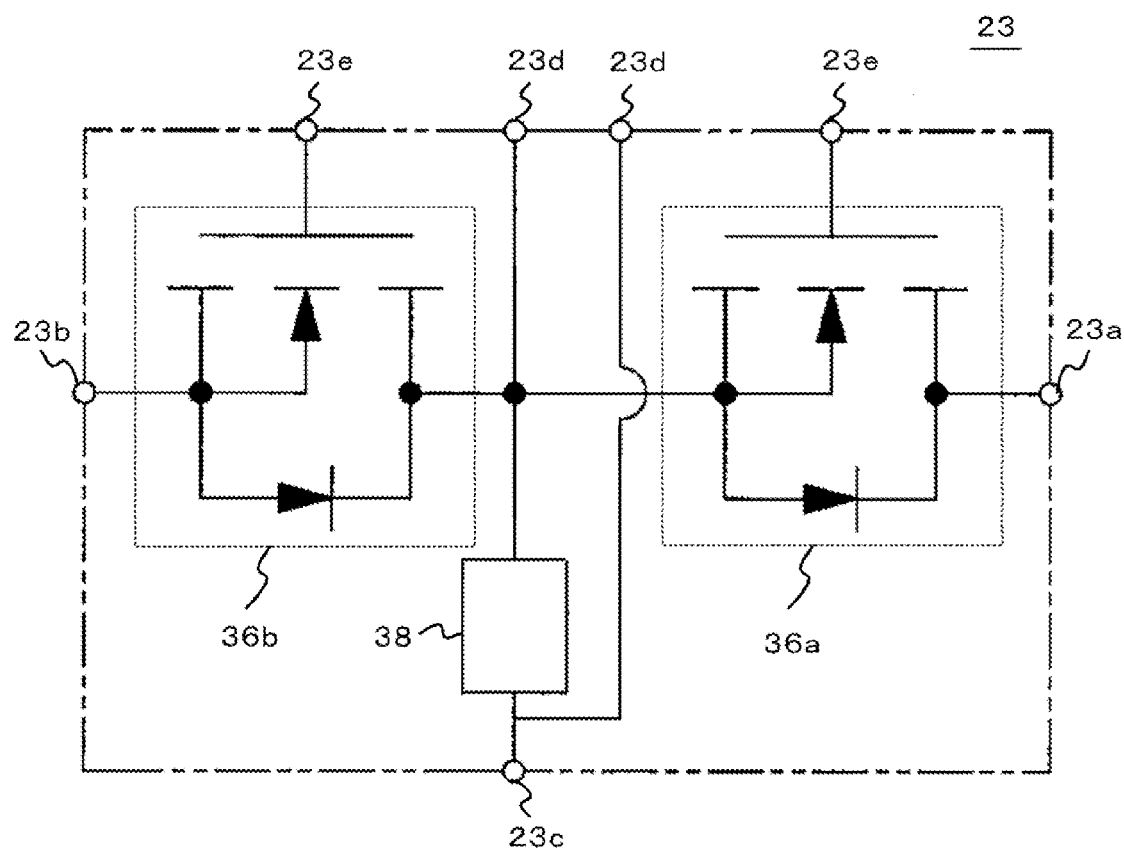
FIG. 7 is an internal wiring diagram of a power module according to Embodiment 3 of the present invention.

FIG. 7 shows an electrical circuit diagram of a power module 23 showing Embodiment 3. In Embodiment 1 and Embodiment 2, the current detector 38 is arranged between the lower arm and the N end terminal 23*b*; however, in this case, a current detector 38 is arranged between a midpoint of upper and lower arms and an AC end terminal 23*c*. This configuration can monitor a current value flowing through the upper arm (a first switching element 36*a*) and the lower arm (a second switching element 36*b*), respectively; and therefore, it becomes possible to attain more highly accurate control in a power converter.

Figure 8:
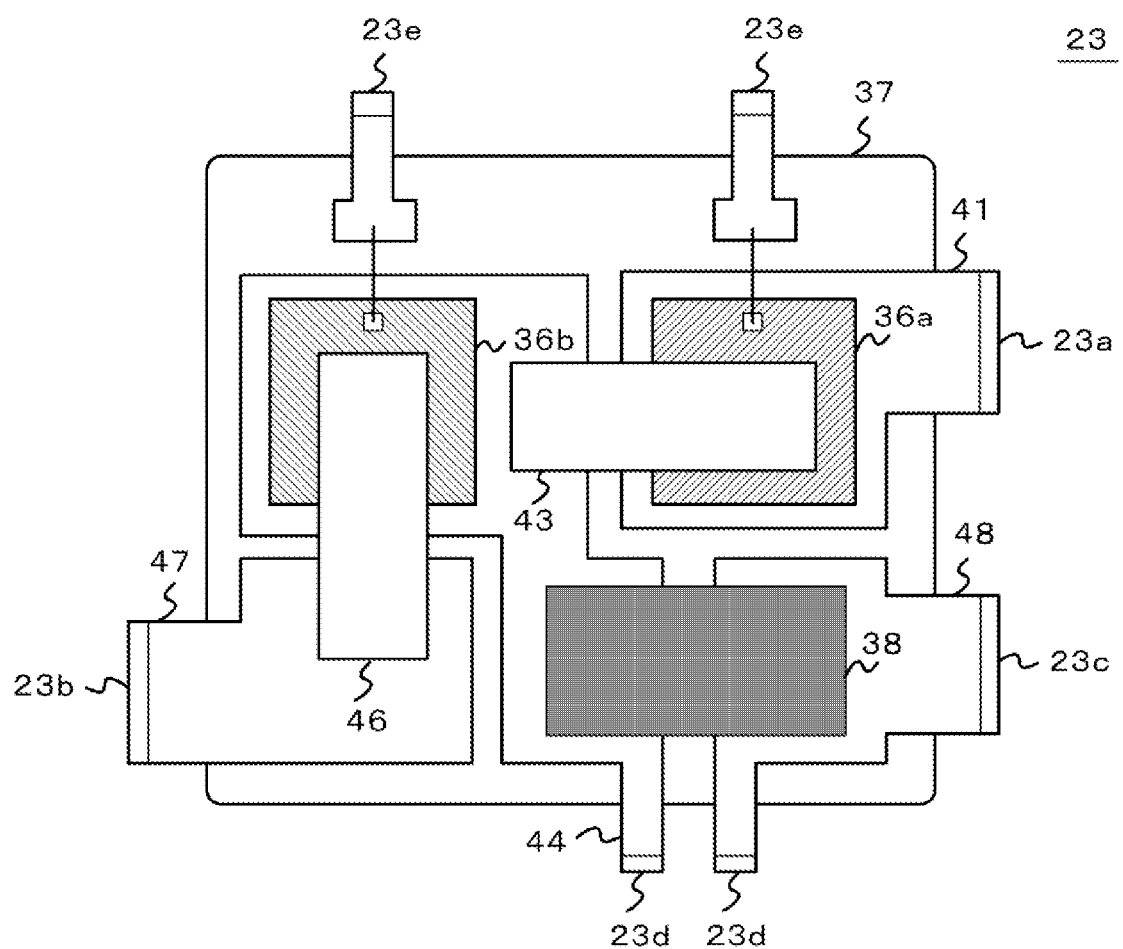
FIG. 8 is a configuration view of the power module according to Embodiment 3 of the present invention.

FIG. 8 shows the mounting configuration of a power module 23 in Embodiment 3. In Embodiment 3, a P end terminal 23*a* and the AC end terminal 23*c* are led out from the same edge. This configuration can provide the shortest circuit path from the P end terminal to the AC end terminal 23*c*; and therefore, inductance can be reduced.

Incidentally, the present invention can freely combine the embodiments and appropriately change or omit the respective embodiments, within the scope of the present invention.

What is claimed is:

1. A rotary electric machine with a power converter, comprising:
    a stator that has stator windings;
    a rotor that has a rotor winding;
    a rotational position detecting sensor that outputs a rotational position signal of said rotor;
    a case that contains said stator and said rotor;
    a field module that is connected to said rotor winding;
    power modules, each of which is connected to each of said stator windings and has a current detector, a first switching element, and a second switching element;
    a heat sink that is fixed to said field module and said power modules; and
    a control substrate that outputs control signals to said field module and said power modules based on the rotational position signal from said rotational position detecting sensor,
    wherein said first switching element is connected in series to said second switching element;
    said current detector, said first switching element, and said second switching element are molded with insulating resin; and
    said current detector is attached in series to said second switching element, and
    further wherein said power module includes:
    a first terminal that is joined to a lower surface electrode of said first switching element;
    a second terminal that is joined to a lower surface electrode of said second switching element;
    a third terminal that is joined to one end of said current detector; and
    a fourth terminal that is joined to the other end of said current detector; and
    said first terminal, said second terminal, said third terminal and said fourth terminal are directly bonded to said heat sink.

2. The rotary electric machine with the power converter according to claim 1,
    wherein an output end terminal of said second terminal and an output end terminal of said fourth terminal are led out from the same side edge of said insulating resin.

3. The rotary electric machine with the power converter according to claim 1, wherein an output end terminal of said first terminal and an output end terminal of said fourth terminal are led out from the same side edge of said insulating resin.

4. A rotary electric machine with a power converter, comprising:

a stator that has stator windings;

a rotor that has a rotor winding;

a rotational position detecting sensor that outputs a rotational position signal of said rotor;

a case that contains said stator and said rotor;

a field module that is connected to said rotor winding;

power modules, each of which is connected to each of said stator windings and has a current detector, a first switching element, and a second switching element;

a heat sink that is fixed to said field module and said power modules; and a control substrate that outputs control signals to said field module and said power modules based on the rotational position signal from said rotational position detecting sensor, wherein said first switching element is connected in series to said second switching element; and said current detector, said first switching element, and said second switching element are molded with insulating resin; and one end of said current detector is attached between said first switching element and said second switching element, and further wherein said power module includes:

a first terminal that is joined to a lower surface electrode of said first switching element;

a second terminal that is connected to a lower surface electrode of said second switching element and one end of said current detector;

a third terminal that is connected to a lead joined to an upper surface electrode of said second switching element; and a fourth terminal that is connected to the other end of said current detector and;

said first terminal, said second terminal, said third terminal and said fourth terminal are directly bonded to said heat sink.

5. The rotary electric machine with the power converter according to claim 4, wherein an output end terminal of said first terminal and an output end terminal of said fourth terminal are led out from the same side edge of said insulating resin.

\* \* \* \* \*